United States Patent

Snyder et al.

[15] 3,694,699

[45] Sept. 26, 1972

[54] CERAMIC BASED SUBSTRATES FOR ELECTRONIC CIRCUITS WITH IMPROVED HEAT DISSIPATING PROPERTIES AND CIRCUITS INCLUDING THE SAME

[72] Inventors: Christopher L. Snyder, Plainfield; Philip S. Hessinger, West Caldwell, both of N.Y.

[73] Assignee: National Beryllia Corp., Haskill, N.J.

[22] Filed: March 30, 1970

[21] Appl. No.: 23,568

[52] U.S. Cl. .............317/100, 174/15 R, 174/DIG. 5

[51] Int. Cl. ...............................................H05k 7/20

[58] Field of Search.174/DIG. 5, DIG. 3, 15 R, 16 R; 317/100, 101 CP, 234 A

[56] References Cited

UNITED STATES PATENTS

| | | | |
|---|---|---|---|
| 3,361,868 | 1/1968 | Bachman | 174/15 X |
| 3,480,837 | 11/1969 | Feldmann | 317/100 |
| 3,492,535 | 1/1970 | Behrendt | 317/100 |

OTHER PUBLICATIONS

IBM Technical Disclosure Bulletin, Heat Conducting Vibration and Shock Mount, Panaro, Vol. 7, No. 1, June 1964, pp. 113.

IBM Technical Discl. Bulletin, Ceramic Substrate with Inherent Heat Exchanger, Pilgram, Vol. 12, No. 5, Oct. 1969, pp. 728.

*Primary Examiner*—Lewis H. Myers
*Assistant Examiner*—Gerald P. Tolin
*Attorney*—Greene & Durr

[57] ABSTRACT

At least one irregularly shaped, metal, radiating film is applied in heat conducting relation to a ceramic substrate which contains, or is adapted to contain, an electronic circuit on a non-conducting or non-coated region thereof.

3 Claims, 8 Drawing Figures

*INVENTORS*
C.L. Snyder
P.S. Hessinger
by Greene and Durr
ATTORNEYS

CERAMIC BASED SUBSTRATES FOR ELECTRONIC CIRCUITS WITH IMPROVED HEAT DISSIPATING PROPERTIES AND CIRCUITS INCLUDING THE SAME

This invention relates to improvements in electronic circuits of the type which are printed or otherwise formed on ceramic insulating substrates and to ceramic substrates employed to make such circuits.

A primary requirement of a substrate for an electronic circuit is that it have good electrical insulating properties, and for this reason, ceramic materials are favored for such circuits. A secondary requirement is that the ceramic material have certain minimum heat dissipating properties so that copper losses and dielectric losses, which heat up the circuit and its substrate, are readily dissipated before the heat adversely affects the operation of the circuit. Many ceramic materials are heat insulators as well as electric insulators and have relatively poor heat dissipating properties and even when a substrate is made of a composition consisting largely of beryllium oxide (a good heat conductor), there is room for improvement in the heat dissipating properties thereof. It has already been proposed to provide the back, or bottom, of a ceramic substrate with integral radiating projections to increase the heat dissipating properties thereof. It has already been proposed to provide the back, or bottom, of a ceramic substrate with integral radiating projections to increase the heat dissipating surface and produce turbulent flow of air passing over said surface. It is more difficult to make ceramic substrates with projections on one side thereof, and the amount by which the radiation surface area can be increased in a ceramic product which is relatively brittle where it has a thin section, is limited.

Among the objects of the present invention is to provide ceramic substrates for use in the production of electronic circuits which has improved heat dissipating properties.

Among other objects of the invention is to produce electronic circuits having ceramic substrates which have improved heat dissipating properties.

Another object of the invention is to provide a process for improving the heat dissipating properties of ceramic substrates for electronic circuits.

The objects of the invention are attained by providing a substantially planar ceramic substrate, which may be in the form of a disk or plate of sufficient thickness to provide the insulation and strength required for the substrate, and which has a top surface for receiving the electronic circuit, and a bottom surface; at least partially covering the bottom surface with a layer of adherent metal in heat conducting contact with the bottom layer; and attaching, in heat conducting contact, an irregularly shaped metal body to the metal layer. Portions of the top surface which do not carry the circuit can also be metallized and equipped with a metal radiating material.

The metal layer can be applied to provide heat conducting contact with the surfaces of said substrate by any of the known methods, including sputtering, vapor deposition, chemical vapor deposition, coating with a paste of powdered metal and firing, etc. Said metal layer can be provided before or after a circuit has been applied to the top surface of the substrate, or it can be formed simultaneously with the circuit layer except that where a metal layer is fired onto said surface, it may be desirable to apply it before the circuit is formed on the top surface.

The metal body which is attached to the metallized layer of the substrate may be attached by brazing, soldering, or welding. Said metal body can take the form of a metal screen or an embossed metal foil. Where a foil is employed, it is preferably embossed to the extent that holes are produced therein to increase the exposed surface area and said holes provide the interruptions in the surface which produce turbulence in the air flowing past the same.

Further objects and features of the invention will be apparent from the reading of the subjoined specification and claims and from a consideration of the accompanying drawings showing several modifications and embodiments of the invention.

Figure 1:
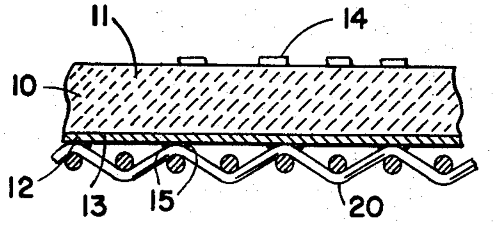
FIG. 1 is a cross-sectional view of an electronic circuit made according to the invention.
Figure 1A:
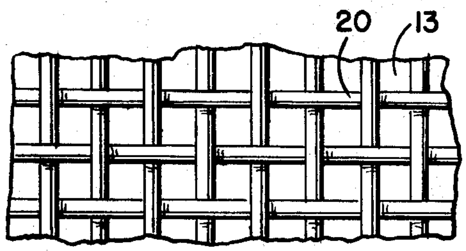
FIG. 1A is a bottom view of the substrate of FIG. 1.

FIGS. 1 and 1A show a fragment of a circuit made with a ceramic substrate 10 having a flat top surface 11 and a flat bottom surface 12. A circuit 14 has been applied to the top surface 11 and the bottom surface 12 has been metallized with a layer 13. A wire screen 20 has been secured to the metallized surface 13 by means of solder or braze 15. The substrate 10 can be formed of any of the usual ceramic substrate materials such as fired alumina, beryllia, ferrites, titanates, etc., or mixtures of composites of such materials; since the substrate is substantially flat on both sides, it is easily formed and can be fired without producing distortions in either surface.

Figure 2:
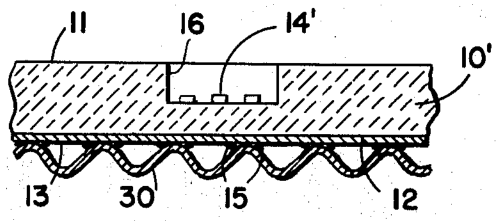
FIGS. 2 and 2A are figures similar to FIGS. 1 and 1A, respectively, but show a modified form of the invention.
Figure 2A:
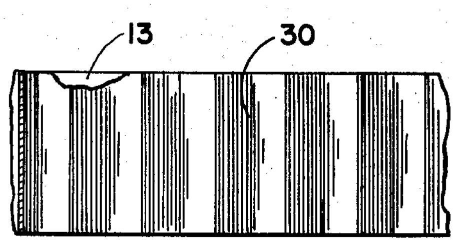

The circuit illustrated in FIGS. 2 and 2A is similar to that of FIGS. 1 and 1A, except that a corrugated foil 30 replaces the wire screen 20 of FIGS. 1 and 1A and the circuit 14' is formed within a slotted or depressed region 16 of the top surface 11. If desired, the corrugated foil 30 can also be punctured to increase the turbulence of air passing over the same.

Figure 3:
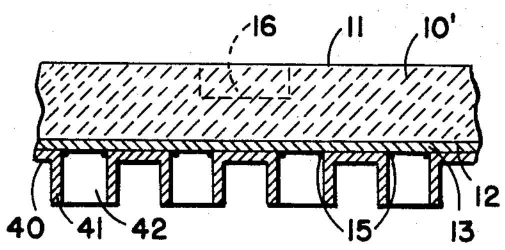
FIGS. 3 and 3A are likewise similar to FIGS. 1 and 1A, but show another modified form of the invention.
Figure 3A:
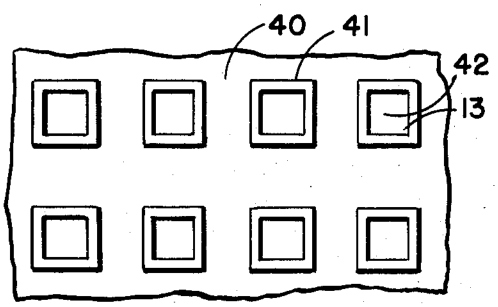

In the modification shown in FIGS. 3 and 3A, the circuit 14 of FIGS. 1–2A has been omitted, and the metal heat radiating means 40 comprises a foil which has been embossed to produce a multiplicity of projections 41 of square cross-section, which are open at the end 42.

Figure 4:
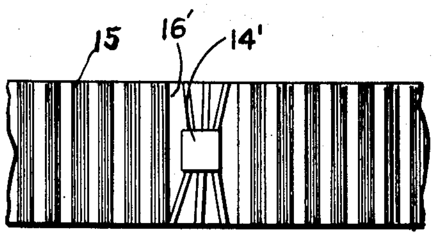
FIGS. 4 and 4A are similar to FIGS. 1 and 1A and show still another modified form of the invention.
Figure 4A:
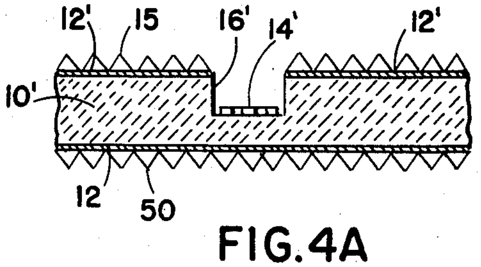

As shown in FIGS. 4 and 4A, it may be desirable to provide a portion of the top surface of the substrate with metal radiating fins also. The substrate 10' has a slot 16' extending all the way across the same, in which the circuit 14' is provided. The bottom surface of the substrate is metallized with a layer 12 and the top surface thereof is metallized with layers 12' and 12'' in the areas on either side of the slot 16'. The series of corresponding ridges of pleated foil 50 are soldered to the metallized layers 12, 12' and 12''.

The following Example further illustrates how a ceramic substrate with the heat radiating metal layer is made.

EXAMPLE I

A substrate similar to substrate 10 of FIGS. 1 and 1A is formed by suspending about 75 parts of ceramic powder, consisting essentially of BeO in 25 parts of a liquid binder solution, such as polyvinyl butral solution in toluene. The suspension or slip is flowed onto a flat surface to provide a thin film, the solvent is evaporated to set the binder and the film further dried to provide a leather hard film which can be punched or cut to shape. After shaping the pieces are fired to maturity. The bottom surface is metallized by the conventional molymanganese process. A copper screen similar to screen 20 of FIG. 1 is hydrogen brazed to the metallized surface. A circuit 16 is applied by silk screen printing. The screen 20 and/or the circuit 16 may be plated with a corrosion resistant metal.

EXAMPLE II

The process is conducted as in Example I, but a ceramic substrate 10', such as shown in FIGS. 2 and 2A is formed by pressing plasticized BeO powder in a die and then firing the same.

I claim:

1. A substrate for an electronic circuit comprising a thin insulating ceramic layer which has a planar upper surface to receive an electronic circuit and a planar lower surface, a metallizing film fixed in heat conducting relationship over substantially all of the lower planar surface of said ceramic layer, and an irregularly shaped metal means bonded to the metallizing film in heat conducting relationship, the irregularities of said metal means providing heat radiating fins of increased surface area, said irregularly shaped metal extending over substantially the entire area covered by the metal film on the lower surface of the ceramic layer.

2. The substrate as claimed in claim 1 wherein said irregularly shaped metal means comprises holes and edges adapted to produce turbulence in air currents passing over the same.

3. The substrate as claimed in claim 1 wherein said planar upper surface contains an electronic circuit.

* * * * *